United States Patent [19]

Keller

[11] 4,026,333

[45] May 31, 1977

[54] APPARATUS FOR PREPARING ELECTRONIC COMPONENT WIRE LEADS PRELIMINARY TO MOUNTING THE COMPONENTS ON CIRCUIT BOARDS

[75] Inventor: Ray V. Keller, Klamath Falls, Oreg.

[73] Assignee: Ventures Unlimited Corporation, Portland, Oreg.

[22] Filed: Sept. 12, 1975

[21] Appl. No.: 612,951

[52] U.S. Cl. .......................... 140/105; 72/DIG. 10
[51] Int. Cl.² ....................................... B21F 45/00
[58] Field of Search ............ 29/203 D; 72/DIG. 10, 72/326, 330–332, 337; 140/1, 71 R, 105

[56] References Cited

UNITED STATES PATENTS

| | | | |
|---|---|---|---|
| 2,361,983 | 11/1944 | Veley | 140/71 R |
| 2,450,920 | 10/1948 | Shand | 140/71 R |
| 3,010,492 | 11/1961 | Ryder et al. | 72/DIG. 10 |
| 3,064,708 | 11/1962 | Kulicke | 72/DIG. 10 |
| 3,147,779 | 9/1964 | Brown | 140/105 |
| 3,900,053 | 8/1975 | Weresch | 140/105 |
| 3,903,934 | 9/1975 | Vizy | 140/105 |

*Primary Examiner*—E. M. Combs
*Attorney, Agent, or Firm*—Eugene D. Farley

[57] ABSTRACT

An apparatus to prepare electronic wire leads for insertion into the holes of printed circuit boards comprises receiving means for receiving the leads, clamping means to clamp the leads into the receiving means, cutting means to cut the leads to a desired length, bending means to bend the terminal portions of the leads to a selected angle, holding means to hold the leads during the bending, and squeezing means further to bend the terminal portion of the leads and squeeze them to a predetermined position relative the remaining portion of the leads. Linkage means interconnect all of the operative elements of the apparatus for single-stepped, timed, sequential operation.

8 Claims, 23 Drawing Figures

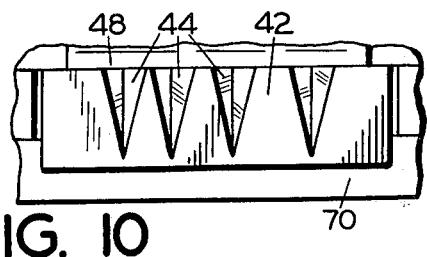
FIG. 10
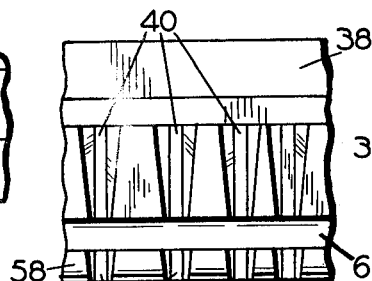
FIG. 11
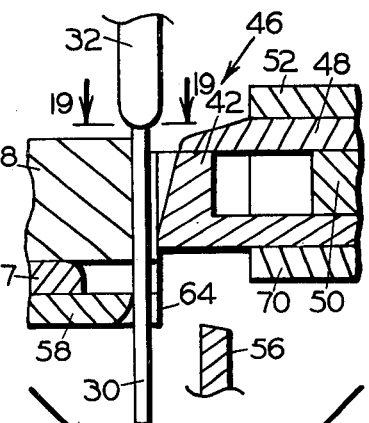
FIG. 12
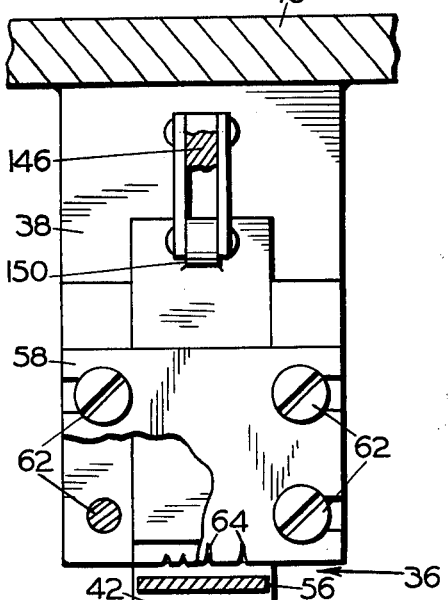
FIG. 5
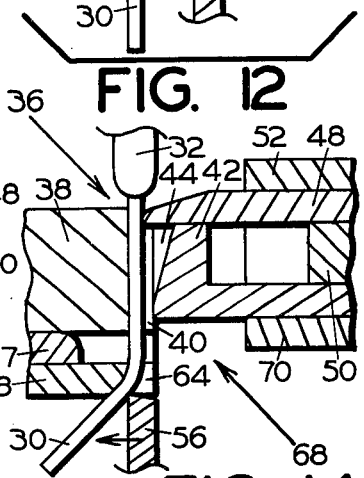
FIG. 13
FIG. 14
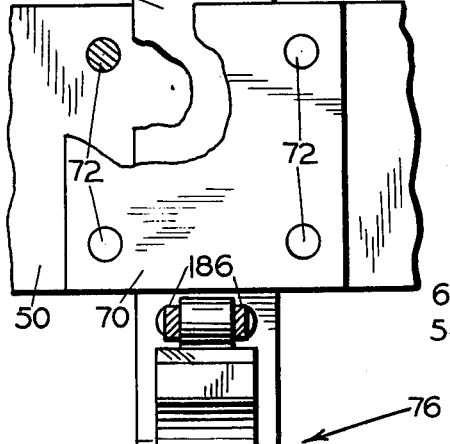
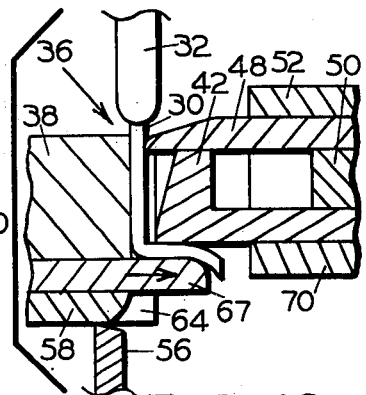
FIG. 15
FIG. 16
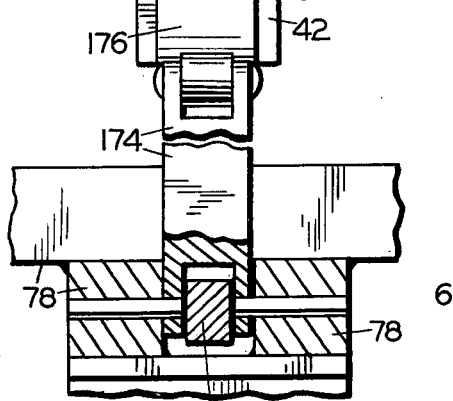
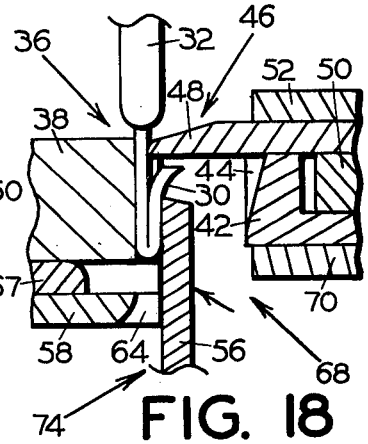
FIG. 17
FIG. 18

APPARATUS FOR PREPARING ELECTRONIC COMPONENT WIRE LEADS PRELIMINARY TO MOUNTING THE COMPONENTS ON CIRCUIT BOARDS

BACKGROUND OF THE INVENTION

This invention relates to an apparatus for the preparation of the wire leads of electronic components to adapt them for insertion into the holes or recesses of an electronic circuit board.

In the manufacture of electronic circuit board assemblies, electronic components such as capacitors, resistors, or similar devices having wire leads, must be prepared before insertion into the holes of the circuit board.

The preparation of the leads generally includes cutting them to a desired length, reversely bending their terminal portions and forming outwardly facing bends at their extremities.

The purpose of such preparation is to make possible positioning the leads at substantially the same height in the circuit board where they are frictionally maintained in the holes while being permanently soldered in place. Thus the electronic components are uniformly positioned in the circuit board in a manner where they will not be easily damaged.

Heretofore the preparation of the leads has been performed by hand, either during installation or beforehand by a preparer. Hand preparation of the leads is slow, requiring the utilization of a skilled worker and a variety of special hand tools.

In addition components having hand prepared leads lack uniformity. The leads are not precisely the same length and the outward facing bends at the extremities of the leads are placed at differing positions along the leads. Thus additional time must be expended when the leads are installed in the holes of the circuit board to uniformly align the components at the same distance above the circuit board.

Accordingly, the general object of the present invention is to provide an apparatus for preparation of leads of electronic components to adapt them for insertion into the mounting holes of circuit boards.

It is a further object of the present invention to provide such an apparatus which prepares the leads in a single, sequential, timed step.

It is a further object of the present invention to provide such an apparatus which prepares the leads uniformly to allow installation of the components at an equal distance above the circuit board.

It is a further object of the present invention to provide such an apparatus which will not damage delicate components when preparing their leads.

It is a further object of the present invention to provide such an apparatus which is fast and uncomplicated in operation for use by an unskilled operator.

THE DRAWINGS

The manner in which the foregoing and other objects of the invention are accomplished will be apparent from the accompanying specification and claims considered together with the drawings wherein:

FIG. 4 is a fragmentary sectional view, partially broken away, taken on the line 4—4 of FIG. 3;

FIG. 5 is a fragmentary sectional view, foreshortened and partially broken away, taken on the line 5—5 of FIG. 2;

FIG. 10 is a fragmentary sectional view taken on line 10—10 of FIG. 2;

FIG. 11 is a fragmentary sectional view taken on the line 11—11 of FIG. 2;

FIGS. 12 through 18 are fragmentary detailed views, in cross-section, with some elements removed, showing the sequence of operation of the apparatus of the present invention;

FIG. 19 is a fragmentary sectional view taken on the line 19—19 of FIG. 12;

FIG. 20 is a fragmentary sectional view taken on line 20—20 of FIG. 13;

FIG. 21 is a view, in side elevation, similar to that of FIG. 1, of an electronic component after it has been prepared by the apparatus of the present invention; and FIGS. 22 and 23 are fragmentary side and front elevations, respectively, illustrating the manner in which the prepared electronic component is installed in a circuit board.

GENERAL STATEMENT OF THE INVENTION

The present invention generally provides an apparatus for preparation of the wire leads of electronic components for insertion into the holes of circuit boards, comprising receiving means for receiving the leads into the apparatus, clamping means to clamp the leads into the receiving means, cutting means to cut the leads to desired length, bending means to bend the terminal portions of the leads to a selected angle, holding means to hold the leads during the bending, and squeezing means to further bend the terminal portions of the leads and squeeze them to a predetermined position relative the body portion of the leads.

DETAILED DESCRIPTION OF A PREFERRED EMBODIMENT

Figure 1:
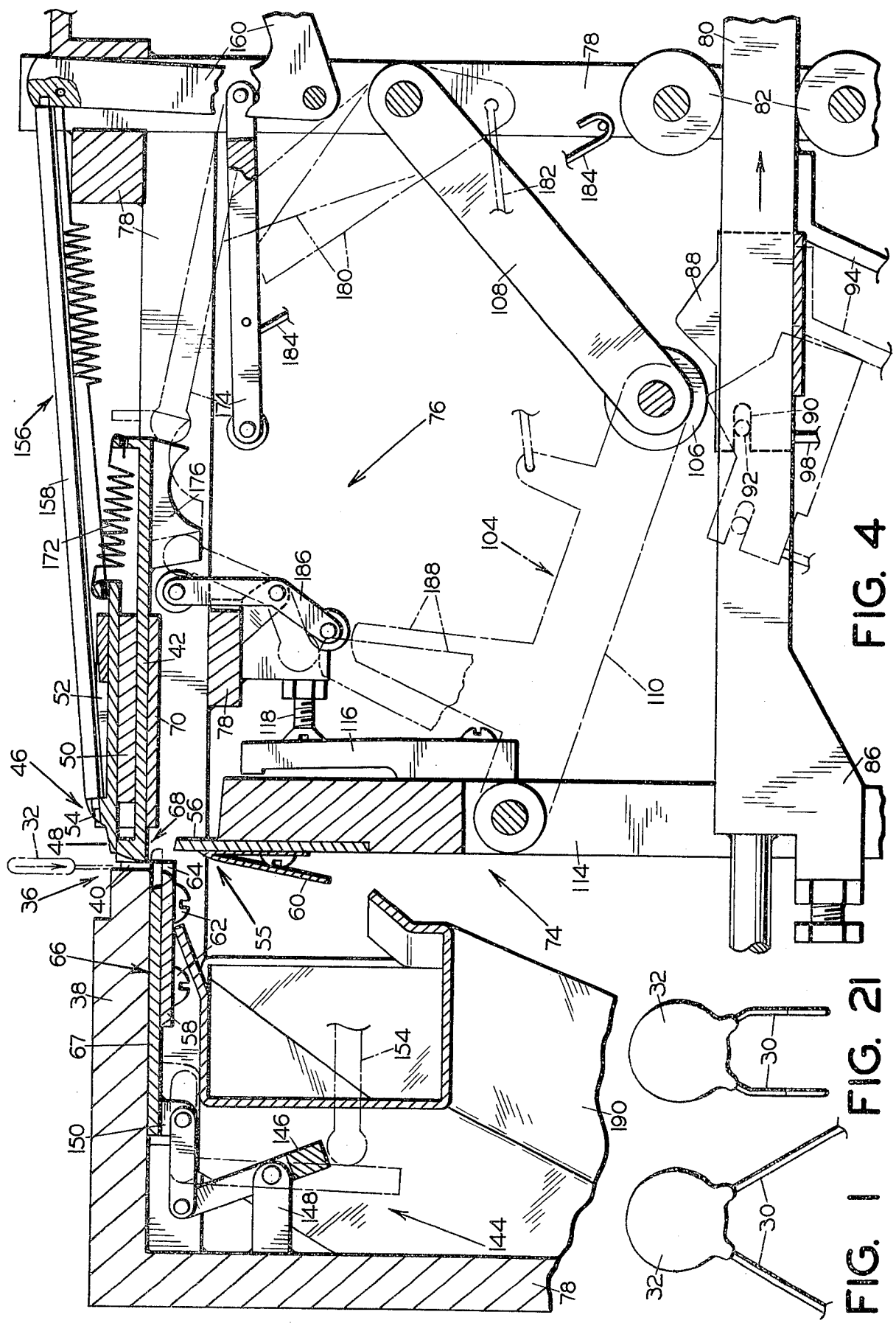
FIG. 1 is a side view of an electronic component typical of the type that may be prepared by the apparatus of my invention.
Figure 2:
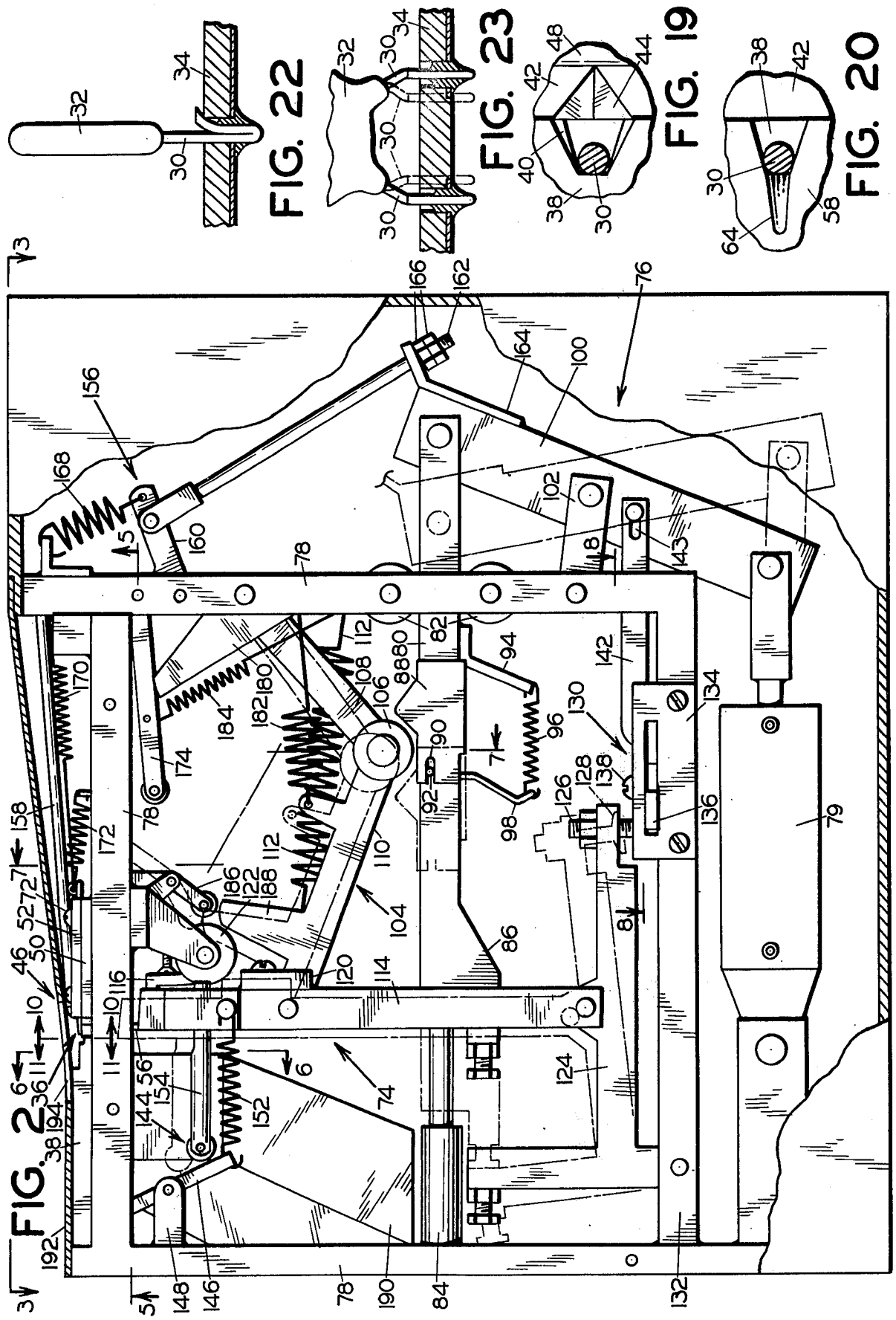
FIG. 2 is a view, in side elevation, partially broken away, of the herein described apparatus.
Figure 3:
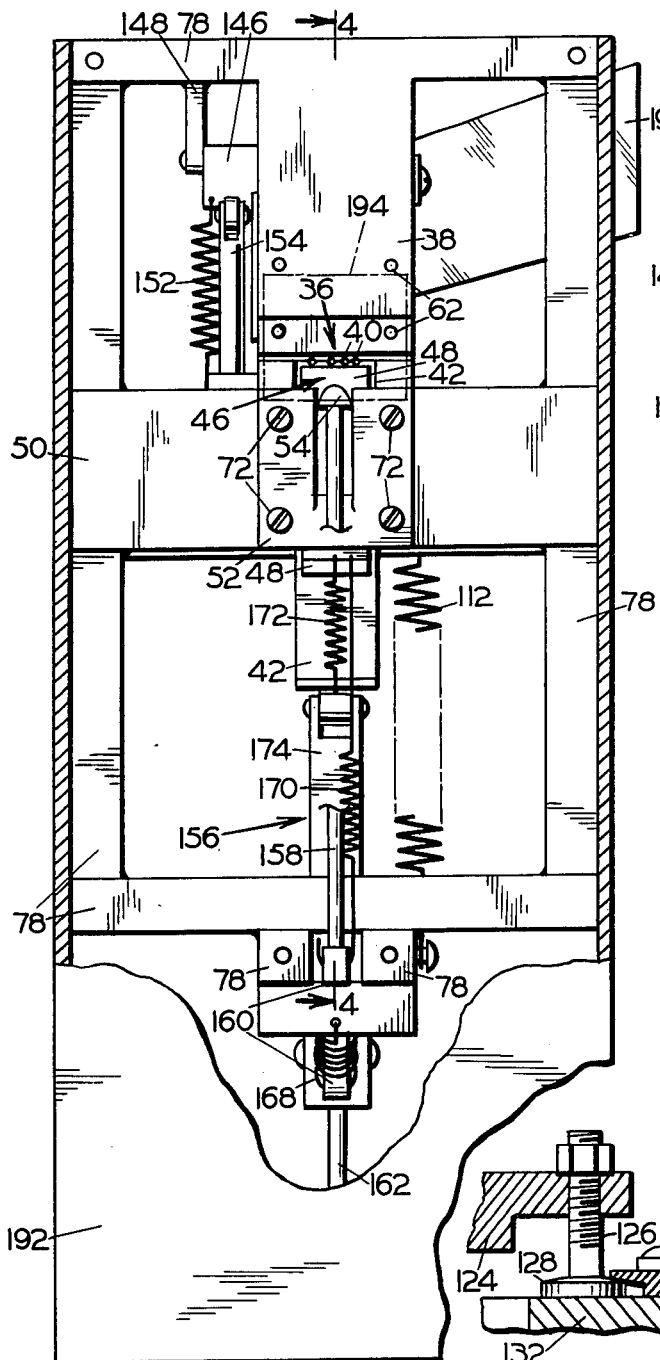
FIG. 3 is a plan view of the apparatus of FIG. 2, partially broken away, looking in the direction of the arrows of line 3—3 of that FIG.
Figure 6:
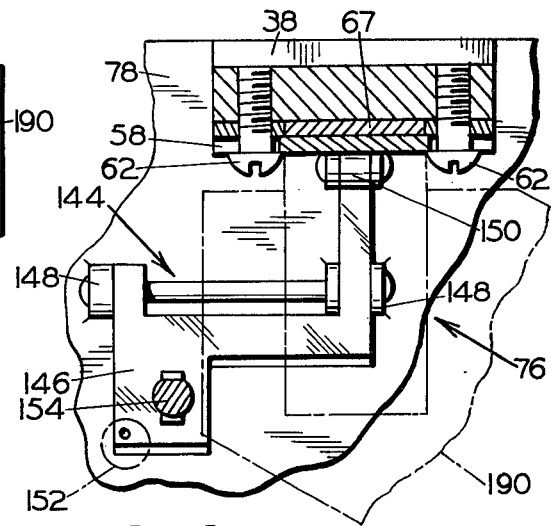
FIG. 6 is a fragmentary sectional view taken on the line 6—6 of FIG. 2.
Figures 8, 9:
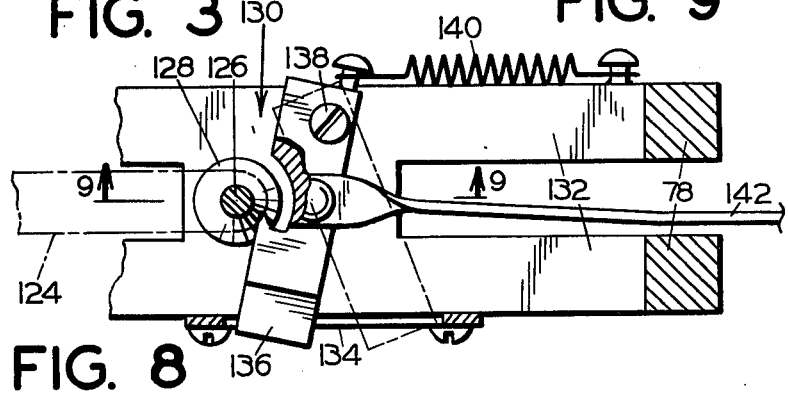
FIG. 8 is a fragmentary sectional view, partially broken away, taken on line 8—8 of FIG. 2.
FIG. 9 is a fragmentary sectional view, taken on line 9—9 of FIG. 8.
Figure 7:
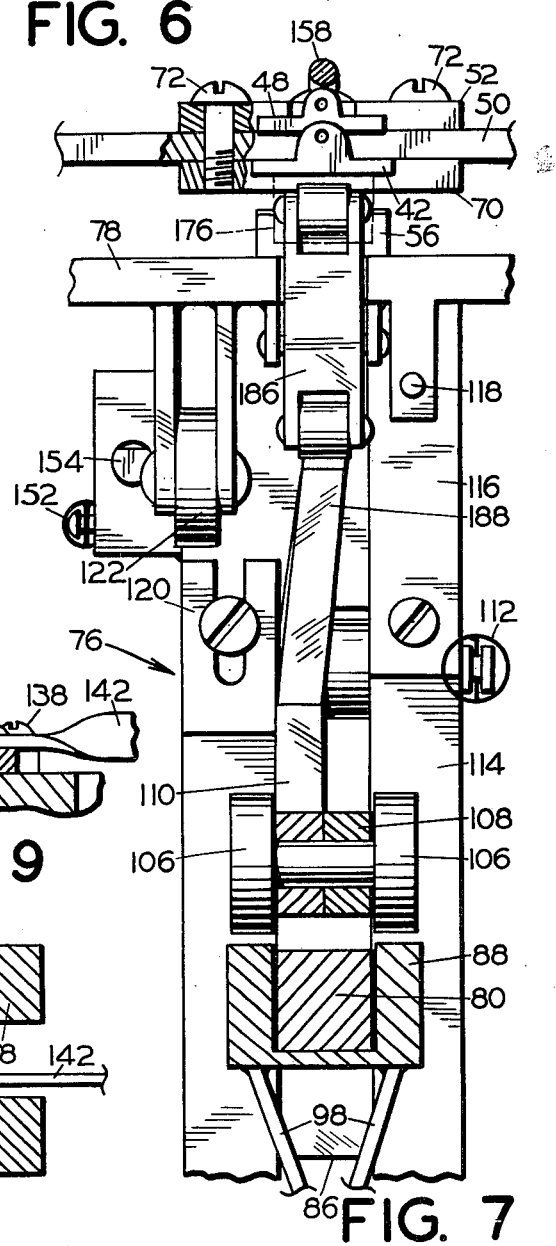
FIG. 7 is a fragmentary sectional view, partially broken away, taken on the line 7—7 of FIG. 2.

Referring to FIGS. 1, 21 and 22 of the drawings, the apparatus of the present invention is intended to prepare the leads 30 of electronic components 32 such as resistors or capacitors for insertion into the holes of circuit board 34.

Referring to FIGS. 2, 3, 4 and 5, the apparatus comprises receiving means 36 for receiving the leads into the apparatus. The receiving means includes wire holding block 38 with wire locating cutouts 40 located vertically at spaced intervals in its front edge. As shown in FIG. 11, the spacing of the wire locating cutouts allows insertion of electronic components having leads spaced at various distances. The wire locating cutouts are downwardly tapered in order to allow ease of entry of the leads. The top of the wire holding block is also stepped at its forward edge to facilitate entry of the leads.

Hold down plate 42 is positioned opposite wire holding block 38. The hold down plate includes wire positioning cutouts 44 located vertically in its front portion at spaced intervals in alignment with wire locating cutouts 40. The wire cutouts are tapered and terminate slightly upwardly of the bottom of the hold down plate.

Clamping means 46 clamps the leads in the receiving means. The clamping means includes clamp 48. The clamp comprises a planar plate freely slideable between hold down bracket 50 and clamp retainer 52. The clamp retainer is bolted to the upper surface of the hold down bracket. A raised rod receiving socket 54 is located centrally on the upper portion of the clamp.

Cutting means 55 comprises knife blade 56 and anvil 58 for cutting the leads to a desired length. The knife blade comprises a vertical plate with a tapered upper cutting edge. Deflector 60 is joined to the outside face of the knife blade to deflect cut leads outwardly away from the knife blade. The anvil is mounted below the holding block, by screws 62, in such a manner that its forward edge substantially is flush with the leading edge of the holding block. Slots 64 located in the front edge of the anvil align with the lower portion of wire locating cutouts 40.

Referring to FIGS. 4 and 20, it will be noted that the lower portion of the slots are arcuately relieved away from the front edge of the anvil.

Bending means 66 bends the terminal portions of the leads at a selected angle preferably approximately 90°. The bending means comprises a planar bending plate 67 having a rounded upper front edge. The bending plate is slideable freely horizontally between holding block 38 and anvil 58.

Holding means 68 holds the body portions of the leads while the terminal portions are being bent by the bending means. The holding means comprises hold down plate 42 which includes a raised head portion and a planar slide portion which is slightly longer than clamp 48. The hold down plate is slideable freely horizontally between hold down retainer 70 and hold down bracket 50. The hold down retainer is joined to the hold down bracket by means such as screws 72.

Squeezing means 74 further bends the terminal portions of the leads and squeezes them to bend them to predetermined positions in relation to the body portions of the leads. Preferably the terminal portions of the leads are reversely bent to positions in parallel adjacency with the body portion of the leads. The squeezing means includes knife blade 56 which also comprises the cutting means.

Linkage means 76 supports and interconnects the clamping means, the cutting means, the bending means, the holding means, and the squeezing means for the timed sequential operation of the apparatus in a single step. The linkage means includes a box frame 78 which encases the apparatus. The box frame preferably is formed from elongate rectangular elements joined together by welding.

Power means 79, such as a pneumatic cylinder, is joined to the box frame to power the apparatus.

Actuating rod 80 is supported slideably, for horizontal movement, at one end in the lower medial portion of the box frame by rollers 82. Actuating rod guide 84 slideably supports the other end of the actuating rod.

Actuating block 86 is joined to the lower portion of the end of the actuating rod supported by the actuating rod guide.

Cam means 88 is mounted centrally on the actuating rod. The cam means comprises a bifurcated element which communicates releasably about the actuating rod. Forwardly facing slots 90 on each side of the cam means engage pins 92 located in the actuating arm to maintain the cam means on the actuating arm.

Cam lock 94 locks the cam means in position on the actuating arm. The cam lock comprises an elongate arm depending from joinder to the actuating arm rearwardly adjacent the cam means. The cam lock includes a notched portion adjacent the actuating rod to engage the rearward portion of the cam means. Spring 96 interengages the cam lock with depending rod 98, joined to the forward portion of the cam means, to urge the cam means back into engagement with the notch portion of the cam lock. Thus forward translation or rotation of the cam means relative pins 92 is prevented.

Rocker arm 100 pivotally interengages the power means and the actuating arm to move the actuating arm forwardly and rearwardly. The rocker arm is mounted centrally and pivotally on rocker arm pivot block 102 which is joined to the box frame.

Articulated cam follower 104 engages cam means 88 for actuation thereby during forward movement of the actuating rod. The cam follower comprises bearings 106 pivotally connected to one end of first push down arm 108 and one end of second push down arm 110. The first push down arm is connected pivotally on its other end to the box frame. Spring 112 interengages the second push down arm and the frame to bias the bearing into contact with the cam means.

Cutter arm 114 comprises a vertical elongate bar having knife blade 56 mounted to its upper extremity. The cutter arm is joined centrally and pivotally to the other end of second push down arm 110 for movement thereby.

Dampener 116 is joined to the cutter arm to engage frame mounted stop 118 thus preventing chatter of the knife blade at the end of its cutting stroke.

Squeeze block 120 is mounted on the cutter arm in a position to engage frame mounted squeeze roller 122. However, when the cutter arm is in the normal, at rest, position, the squeeze block is located below the squeeze roller.

Cutter tilt arm 124 comprises a horizontally positioned T-shaped element. The short lower portion of the vertical leg is mounted pivotally to the box frame and the longer upper portion of the vertical leg is configured to be engaged by actuating block 86 when the actuating rod nears the end of its forward movement. The horizontal leg of the cutter tilt arm is joined centrally and pivotally to the lower extremity of cutter arm 114. Locking bolt 126 with enlarged foot 128 depends from the extremity of the horizontal leg of the cutter tilt arm.

Locking means 130 releasably engages foot 128 to lock the horizontal leg of the cutter tilt arm in a horizontal orientation. The locking means comprises lower frame portion 132 with side mounted guide plate 134. Locking arm 136 is attached pivotally to the lower frame portion by screw 138 to fit into the guide plate. Spring 140 interengages the locking arm and the lower frame portion to urge the locking arm over foot 128 to lock the cutter tilt arm. Release arm 142 interengages the center portion of the locking arm and rocker arm 100. The release arm is joined to the rocker arm by means of slot 143 so that there is no movement of the release arm until the rocker arm is near the mid-point of its travel.

Bending plate linkage 144 comprises articulated rocker arm linkage 146 pivotally mounted on holders 148 which are frame mounted. The rocker arm linkage is joined to bending plate 67 by ear 150. Spring 152 interconnects the rocker arm linkage and cutter arm 114 to urge the bending plate to its normally retracted position. Bending push rod 154 extends horizontally from joinder to the upper portion of the cutter arm to a position near the lower surface of the rocker arm linkage. The bending push rod slideably fits in an opening in the cutter arm to allow adjustment. A set screw (not shown) locks the bending push rod in the cutter arm.

Clamping linkage 156 interconnects the rocker arm and the clamping means to position the clamp in a clamped position. Clamp push rod 158 engages rod receiving socket 54 of the clamp. Clamp push rod arm 160 comprises an L-shaped element, pivotally joined to the box frame, having a substantially vertical leg and a substantially horizontal leg. The vertical leg of the clamp push rod arm engages the other end of the clamp push rod.

Clamp actuating arm 162 interengages the upper end of rocker arm 100 and the horizontal leg of the clamp push rod arm. The clamp actuating arm is not joined rigidly to the rocker arm, but slideably engages bracket 164 located on the rocker arm. Nuts 166 mounted on the end of the clamp actuating arm engage the bracket to limit the movement of the clamp actuating arm. Thus the rocker arm urges the clamp actuating arm downwardly to open the clamp when the power means is retracted.

Clamp positioning spring 168 interengages the horizontal leg of clamp push rod arm 160 and the box frame to urge the clamp into a clamping position when rocker arm 100 is pivoted. Push rod spring 170 interengages the end of clamp 48 and the vertical leg of the clamp push rod arm to keep the clamp push rod positioned therebetween.

Hold down biasing spring 172 interengages the rear portion of clamp 48 and the rear portion of hold down plate 42 to bias the hold down plate against the leads when the clamp is in the clamped position.

Hold down arm 174 locks the hold down plate in its position against the leads. The hold down arm is mounted pivotally on the box frame for movement between a raised position and a lowered position. Dog 176 attached to the lower extremity of the hold down plate engages the hold down arm when the hold down arm is in the raised position.

Lever 180 is joined pivotally to the box frame to engage the hold down arm and position it between the raised and lowered position. First hold down arm spring 182 interengages the lever with second push down arm 110 to raise the lever when the second push down arm is raised. Second hold down arm spring 184 interengages the hold down arm and the box frame to bias the hold down arm to its lowered position when the second push down arm is lowered.

Hold down lifting arm 186 moves the hold down plate to a position away from the leads. The hold down lifting arm comprises an angled element pivotally joined to the box frame. The upper portion of the hold down lifting arm engages dog 176 oppositely hold down arm 174. Activating arm 188 attached to the upper portion of second push down arm 110 engages the lower portion of the hold down lifting arm.

Dispenser 190 channels the cut leads from deflector 60 of the knife blade out of the apparatus.

Case 192 joins to the box frame to enclose the apparatus protecting the linkage means. Window 194 on the top portion of the frame opposite the receiving means allows insertion of the leads into the apparatus.

OPERATION

Referring to FIGS. 12–18 of the drawings, the manner of use of the herein described apparatus for preparation of electronic component wire leads is as follows:

Leads 30 of the electronic components to be prepared are inserted into receiving means 36 of the apparatus. When the leads are inserted, power means 79 will be located in a retracted position locating the linkage means in an at rest position. Thus in the FIG. 2 position of the apparatus, clamp 48 is urged to a position away from the leads by clamping linkage 156, hold down arm 174 does not engage hold down plate 42, and bending plate 67 is located in a retracted position.

To initiate the operation of the apparatus the operator activates control means (not shown) to operate the power means. As the power means initiates movement of rocker arm 100, clamp actuating arm 162 is released from bracket 164. This allows clamp positioning spring 168 to pivot clamp push rod arm 160, thereby translating clamp push rod 158 to place clamp 48 in a clamped position to clamp the leads in the receiving means, as shown in FIG. 13.

When the clamp thus is placed in the clamping position, hold down biasing spring 172 urges the holding means in a position against the leads.

Rocker arm 100 simultaneously moves to translate actuating rod 80 and cam means 88 forwardly. The cam means thus engages bearings 106 of the articulated cam followers. It will be noted that when the cam is moved in the forward direction, spring 96 urges the cam means into the notched portion of cam lock 94, preventing rotation of the cam means about pins 92.

As the bearings move upward on the cam means, spring 182, connected to second push down arm 110, pivots lever 180 upwardly. The lever thus urges hold down arm 174 to its raised position behind dog 176 located on the hold down plate, to lock the hold down plate in a position adjacent the leads.

Also, as the bearing moves upwardly on the cam means, the second push down arm pivots cutter arm 114 about its connection to cutter tilt arm 124 for substantially horizontal movement of knife blade 56, as shown in FIG. 14. It will be noted that locking means 130 engages foot 128 of the locking bolt locking the cutter tilt arm in its horizontal orientation.

As the knife blade comes into contact with the leads, the leads are urged into slots 64 located in the leading edge of anvil 58 bending the extremities of the leads to slight backward facing angles, as shown in FIG. 14. As the knife blade continues to travel horizontally, it cuts the leads, as shown in FIG. 15.

Further horizontal travel of the upper portion of the cutter arm brings bending push rod 154 into contact with the lower portion of rocker arm linkage 146. The rocker arm linkage thus is pivoted about holders 148 to translate bending plate 67 horizontally, as shown in Fig. 16, to bend the terminal portion of the leads approximately 90°.

Further travel of the actuating rod positions cam means 88 past center of bearing 106 so that the cam follower drops to its lowered position. Spring 112 then repositions the cutter arm in a vertical orientation, thus retracting the bending plate, the knife blade, and lever 180. First hold down arm spring 182 moves hold down arm 174 away from contact with dog 176.

At this time, actuating block 86 contacts the upper vertical leg of cutter tilt arm 124. Simultaneously, release arm 142 is engaged by the rocker arm to pivot locking arm 136 away from foot 128 to unlock the cutter tilt arm.

Thus the cutter tilt arm pivots about the lower portion of its vertical leg to move the cutter arm and thus the knife blade upwardly, as shown in FIG. 17, to continue bending the terminal portion of the leads.

As the cutter arm is moved upwardly, squeeze block 120 comes into contact with squeeze roller 122 to move the knife blade inwardly, as shown in FIG. 18. Thus the terminal portions of the leads are bent reversely and squeezed to positions in parallel adjacency with the body portions of the leads. As the cutter arm starts to move upwardly, activating arm 188 engages hold down lifting arm 186 which in turn engages dog 176 to move hold down plate 42 away from the leads. This allows clearance for the leads to pass when being bent upwardly.

The preparation of the leads now being completed, the power means are retracted to place the linkage means in its at rest position for the start of another cycle.

When the actuating rod is moved in the rearward direction bearings 106 come into contact with the rearward facing face of the cam means thus translating the cam means on the actuating rod out of contact with the notch of cam lock 94. The cam means pivots downwardly on pins 92, as shown in the phantom lines of FIG. 4, to allow the rollers to pass thereover without being lifted. Thus the linkage means are not operated during return of the actuating arm.

Having thus described my invention in a preferred embodiment, I claim:

1. Apparatus for preparation of electronic component leads, comprising:
   a. receiving means for receiving the leads into the apparatus,
   b. clamping means mounted movably on the apparatus adjacent the receiving means for clamping the leads in the receiving means,
   c. cutting means movable relative to the receiving means for cutting the clamped leads to a desired length for providing the leads with an inner body portion and an outer terminal portion, the cutting means comprising a knife blade, an anvil and a cutter arm supporting the knife blade, and the cutter arm is mounted in the apparatus for movement of the knife blade relative to the anvil in a direction substantially normal to the leads,
   d. bending means mounted movably on the apparatus adjacent the receiving means for bending the terminal portions of the leads to a selected angle, the bending means comprising a bending plate positioned adjacent the anvil and movable relative thereto in a direction substantially normal to the leads,
   e. holding means located opposite the bending means and movable relative to the receiving means for holding the body portions of the leads as the terminal portions are bent by the bending means,
   f. squeezing means movable relative to the receiving means for further bending the bent terminal portions of the leads and squeezing them to a predetermined position relative to the body portions of the leads,
   g. linkage means interconnecting the clamping means, the cutting means, the bending means, the holding means and the squeezing means for operating them on a timed sequence, and
   h. power means joined to the linkage means for operating the latter,
   i. the linkage means comprising
      1. a box frame,
      2. an actuating rod supported movably by the box frame for movement therein,
      3. cam means mounted centrally on the actuating rod for movement therewith,
      4. a rocker arm interengaging the actuating arm and the power means for moving the actuating arm in an activating direction and in a return direction,
      5. an articulated cam follower comprising
         a. bearings for engagement with the cam means,
         b. a first push down arm pivotally interengaging the bearings and the box frame, and
         c. a second spring biased push down arm pivotally connected on one end to the bearings to urge the bearings into contact with the cam means,
      6. a cutter arm joined centrally to the other end of the second push down arm for movement substantially normal to the leads when the bearings of the articulated cam follower initially engage the cam means when the cam means moves in the activating direction,
      7. the knife blade being mounted at the upper end of the cutter arm,
      8. a cutter tilt arm joined pivotally at one end to the box frame for movement between a raised and a lowered position,
      9. a bending plate linkage joined to the other extremity of the cutter arm for engagement with the bending plate to move the bending plate in a direction substantially normal to the leads when the bearings of the articulated cam follower engage the medial portion of the cam means moving in the activating direction,
      10. locking means releasably locking the cutter tilt arm to maintain it in its lowered position,
      11. an unlocking arm joined to the rocker arm to release the locking means when the rocker arm is substantially at the end of its travel, after the bearings of the articulated cam follower have passed center engagement with the cam,
      12. an actuating block joined to the end of the actuating rod to engage the cutter tilt arm after release of the locking means to pivot the cutter tilt arm to its raised position for movement of the knife blade in a direction substantially parallel the leads, and
      13. a squeeze block mounted on the cutter arm and a squeeze roller mounted on the box frame, the squeeze roller being positioned to engage the squeeze block as the cutter tilt arm is moved to its raised position to move the knife blade diagonally toward the leads.

2. The apparatus of claim 1 wherein the cam means is releasable pivotally from the activating arm when the activating arm is moved in its return direction.

3. The apparatus of claim 1 including clamping linkage which interconnects the rocker arm and the clamping means to engage the clamping means when the rocker arm initiates travel.

4. The apparatus of claim 1 including a hold down biasing spring to bias the holding means to a position adjacent the leads.

5. The apparatus of claim 4 including
 a. a hold down arm pivotally mounted to the box frame and movable between a raised position, locking the holding means in its position adjacent the leads, and a lowered position, releasing the holding means,
 b. a lever pivotally positioned in the box frame for engagement with the hold down arm and first spring means interengaging the second push down arm and the lever to urge the hold down arm to its raised position when the bearings of the articulated cam follower are in engagement with the cam means, and
 c. second spring means interengaging the hold down arm and the box frame to bias the hold down arm to its lowered position when the bearings of the articulated cam follower have passed engagement with the cam means.

6. The apparatus of claim 5 including a hold down lifting arm and an activating arm joined to the second push down arm, and the hold down lifting arm interengages the holding means and the activating arm to position the holding means away from the leads when the cutter tilt arm is moved to its raised position.

7. Apparatus for preparing electronic component leads, comprising:
 a. receiving means for receiving the leads into the apparatus,
 b. clamping means mounted movable on the apparatus adjacent the receiving means for clamping the leads in the receiving means,
 c. cutting means movable relative to the receiving means for cutting the clamped means to a desired length for providing the leads with an inner body portion and an outer terminal portion, the cutting means comprising a knife blade, an anvil and a cutter arm supporting the knife blade, the cutter arm being mounted in the apparatus for movement of the knife blade relative to the anvil in a direction substantially normal to the leads,
 d. bending means mounted movably on the apparatus adjacent the receiving means for bending the terminal portions of the leads substantially normal to the body portions, the anvil including an arcuate leading edge positioned and contoured for bending the outer ends of the terminal portions of the leads simultaneously with the cutting, in a direction opposite the bending of the terminal portions by the bending means,
 e. holding means located opposite the bending means and movable relative to the receiving means for holding the body portions of the leads as the terminal portions are bent by the bending means,
 f. squeezing means movable relative to the receiving means for further and reversely bending the bent terminal portions of the leads and squeezing them to a predetermined position adjacent the body portions of the leads,
 g. linkage means interconnecting the clamping means, the cutting means, the bending means, the holding means and the squeezing means for operating them on a timed sequence, and
 h. power means joined to the linkage means for operating the latter.

8. Apparatus for preparing electronic component leads, comprising:
 a. receiving means for receiving the leads into the apparatus,
 b. clamping means mounted movably on the apparatus adjacent the receiving means for clamping the leads in the receiving means,
 c. cutting means movable relative to the receiving means for cutting the clamped leads to a desired length for providing the leads with an inner body portion and an outer terminal portion, the cutting means comprising a knife blade, an anvil and a cutter arm supporting the knife blade, the cutter arm being mounted in the apparatus for movement of the knife blade relative to the anvil in a direction substantially normal to the leads,
 d. bending means mounted movably on the apparatus adjacent the receiving means for bending the terminal portions of the leads substantially normal to the body portions, the bending means comprising a bending plate positioned adjacent the anvil and movable relative thereto in a direction substantially normal to the leads for bending the terminal portions substantially normal to the body portions thereof,
 e. holding means located opposite the bending means and movable relative to the receiving means for holding the body portions of the leads as the terminal portions are bent by the bending means,
 f. squeezing means movable relative to the receiving means for further and reversely bending the bent terminal portions of the leads and squeezing them to a predetermined position adjacent the body portions of the leads, the squeezing means comprising the knife blade of the cutting means and a cutter tilt arm which is joined to the cutter arm, the cutter tilt arm being mounted in the apparatus to move the knife blade first substantially parallel to the body portions of the leads and then diagonally toward them for bending the terminal portions further toward the body portions thereof from said substantially normal position,
 g. linkage means interconnecting the clamping means, the cutting means, the bending means, the holding means and the squeezing means for operating them on a timed sequence, and
 h. power means joined to the linkage means for operating the latter.

* * * * *